(12) United States Patent
Yao et al.

(10) Patent No.: US 9,478,437 B2
(45) Date of Patent: Oct. 25, 2016

(54) METHODS FOR REPAIRING LOW-K DIELECTRICS USING CARBON PLASMA IMMERSION

(75) Inventors: Daping Yao, Portland, OR (US); Peter I. Porshnev, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 498 days.

(21) Appl. No.: 13/150,843

(22) Filed: Jun. 1, 2011

(65) Prior Publication Data

US 2012/0309114 A1 Dec. 6, 2012

(51) Int. Cl.
*H01L 21/02* (2006.01)
*H01L 21/3115* (2006.01)
*H01J 37/32* (2006.01)
*H01L 21/3105* (2006.01)
*H01L 21/768* (2006.01)

(52) U.S. Cl.
CPC .... *H01L 21/31155* (2013.01); *H01J 37/32412* (2013.01); *H01L 21/0228* (2013.01); *H01L 21/0234* (2013.01); *H01L 21/02126* (2013.01); *H01L 21/02274* (2013.01); *H01L 21/02321* (2013.01); *H01L 21/3105* (2013.01); *H01L 21/76814* (2013.01); *H01L 21/76826* (2013.01); *H01L 21/76831* (2013.01); *H01L 2221/1063* (2013.01)

(58) Field of Classification Search
CPC ............. H01L 21/31155; H01L 21/76814; H01L 21/76831; H01L 21/76826; H01L 21/0234; H01L 21/3105; H01L 21/02126; H01L 21/02274; H01L 21/02321; H01L 21/0228; H01L 2221/1063; H01J 37/32412
See application file for complete search history.

(56) References Cited

U.S. PATENT DOCUMENTS

| | | | |
|---|---|---|---|
| 5,641,545 A * | 6/1997 | Sandhu | 427/573 |
| 6,114,259 A | 9/2000 | Sukharev et al. | |
| 2004/0072436 A1* | 4/2004 | RamachandraRao et al. | 438/692 |
| 2005/0017365 A1 | 1/2005 | RamachandraRao et al. | |
| 2005/0077597 A1 | 4/2005 | Toma et al. | |
| 2006/0081558 A1* | 4/2006 | Collins et al. | 216/67 |
| 2006/0172530 A1 | 8/2006 | Cheng et al. | |
| 2006/0172531 A1 | 8/2006 | Lin et al. | |
| 2007/0152336 A1* | 7/2007 | Lee et al. | 257/758 |
| 2008/0035987 A1* | 2/2008 | Hebert | H01L 21/26586 257/330 |
| 2008/0157293 A1* | 7/2008 | Hwang | 257/642 |
| 2009/0140418 A1 | 6/2009 | Li et al. | |
| 2011/0014489 A1* | 1/2011 | Ivanov et al. | 428/603 |
| 2012/0077349 A1* | 3/2012 | Li et al. | 438/762 |

OTHER PUBLICATIONS

International Search Report and Written Opinion mailed Jan. 21, 2013 for PCT Application No. PCT/US2012/040094.
Search Report for Taiwan Invention Patent Application No. 101117617 dated Dec. 1, 2015.

* cited by examiner

*Primary Examiner* — William F Kraig
*Assistant Examiner* — Stanetta Isaac
(74) *Attorney, Agent, or Firm* — Moser Taboada; Alan Taboada

(57) ABSTRACT

Methods for repairing low-k dielectrics using a plasma immersion carbon doping process are provided herein. In some embodiments, a method of repairing a low-k dielectric material disposed on a substrate having one or more features disposed through the low-k dielectric material may include depositing a conformal oxide layer on the low-k dielectric material and within the one or more features; and doping the conformal oxide layer with carbon using a plasma doping process.

20 Claims, 4 Drawing Sheets

METHODS FOR REPAIRING LOW-K DIELECTRICS USING CARBON PLASMA IMMERSION

FIELD

Embodiments of the present invention generally relate to substrate processing.

BACKGROUND

During semiconductor manufacturing, processes such as chemical mechanical polishing and etching may cause carbon loss in a low-k dielectric layer disposed on a substrate, resulting in an increase in the dielectric constant, or k value, of the dielectric layer.

Accordingly, the inventors have provided improved methods for repairing low-k dielectrics.

SUMMARY

Methods for repairing low-k dielectrics using a plasma immersion carbon doping process are provided herein. In some embodiments, a method of repairing a low-k dielectric material disposed on a substrate having one or more features disposed through the low-k dielectric material may include depositing a conformal oxide layer on the low-k dielectric material and within the one or more features; and doping the conformal oxide layer with carbon using a plasma doping process.

In some embodiments, a method of repairing a low-k dielectric material disposed on a substrate is provided where the substrate comprises a conductive layer, a hard mask layer disposed over the conductive layer, and a low-k dielectric layer disposed over the hard mask layer, wherein one or more features are disposed through the low-k dielectric layer and the hard mask layer to expose a surface of the hard mask layer. The method may include depositing a conformal oxide layer comprising silicon dioxide on the low-k dielectric material and within the one or more features; doping the conformal oxide layer with carbon in a plasma doping chamber; removing the conformal oxide layer from a bottom surface of the one or more features; and filling the one or more features with a conductive material.

In some embodiments, the inventive methods described herein may be embodied in a computer readable medium. The computer readable medium has instructions stored thereon that, when executed, cause a process chamber to perform a method of cooling a process chamber component in accordance with any of the methods described herein.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
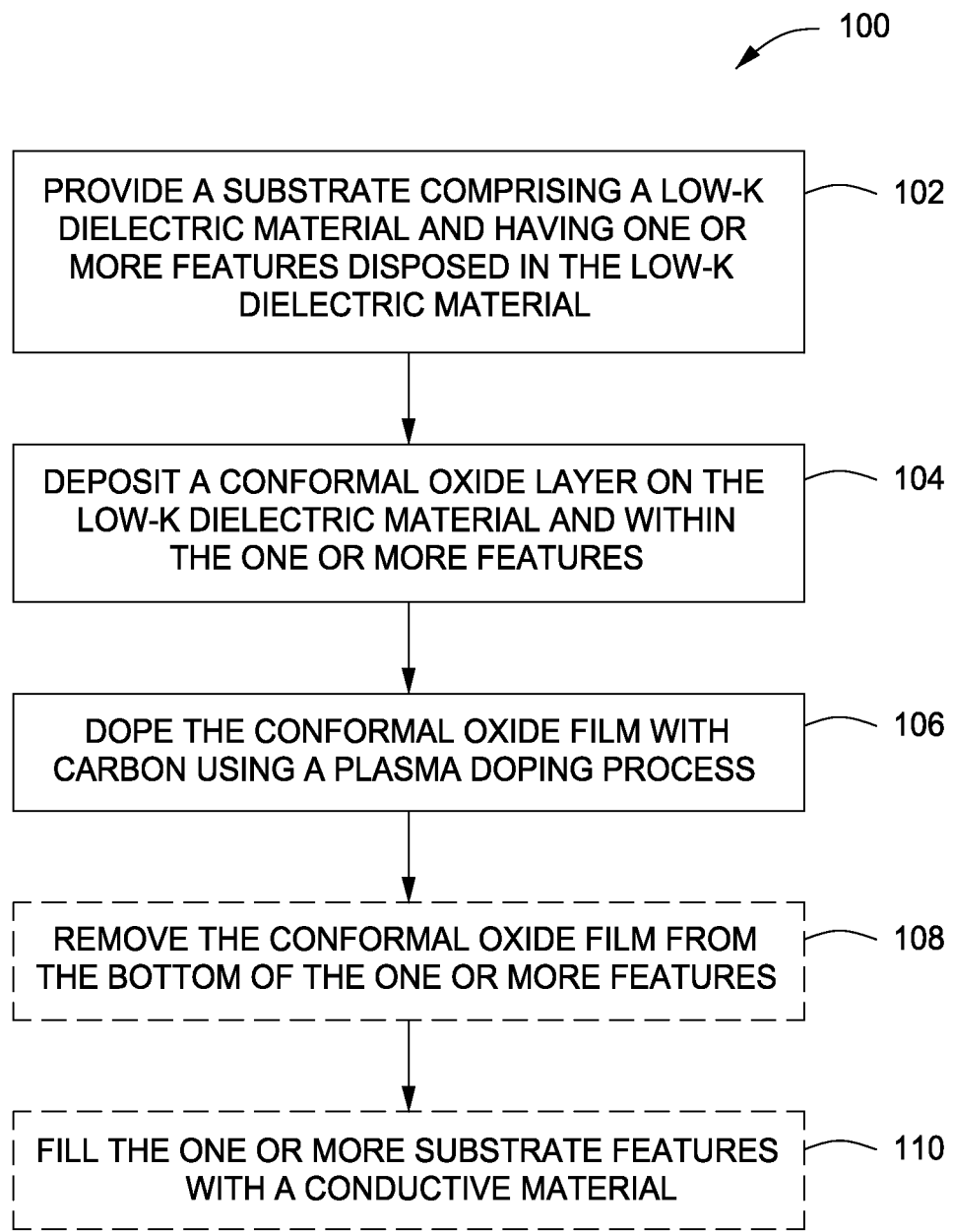
FIG. 1 is a flow diagram of a method of repairing low-k dielectrics using carbon plasma immersion in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention provide improved methods for repairing low-k dielectrics using carbon plasma immersion. Embodiments of the present invention may advantageously provide improved conformality and reduced thickness of a conformal oxide layer. In addition, embodiments of the present invention may enable extreme low-k dielectrics to be used, for example, in sub-2x technology nodes.

FIG. 1 depicts a method 100 for repairing low-k dielectrics using carbon plasma immersion in accordance with some embodiments of the present invention. FIGS. 2A-2E are illustrative cross-sectional views of a substrate during different stages of the method depicted in FIG. 1, in accordance with some embodiments of the present invention. The method 100 may be performed in any apparatus suitable for carbon plasma immersion in accordance with embodiments of the present invention, for example such as the plasma immersion ion implantation process chamber 300 discussed below with respect to FIG. 3.

Figure 2A:
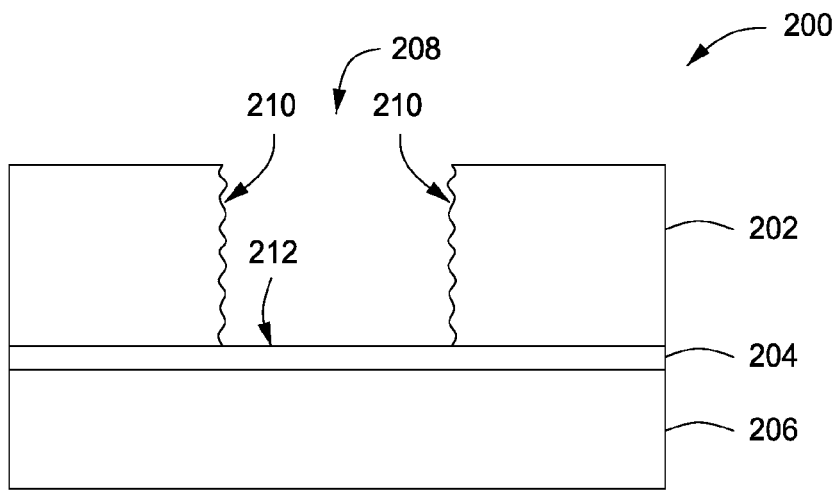
FIGS. 2A-2E depict illustrative cross-sectional views of a substrate during different stages of fabrication in accordance with some embodiments of the present invention.

The method 100 generally begins at 102, where a substrate 200 is provided, as depicted in FIG. 2A. The substrate 200 may be any suitable substrate, such as a silicon substrate, a III-V compound substrate, a silicon germanium (SiGe) substrate, an epi substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 200 may be a semiconductor wafer (e.g., a 200 mm, 300 mm, or the like silicon wafer).

In some embodiments, the substrate 200 may comprise one or more layers. The substrate 200 comprises at least a low-k dielectric layer 202 to be processed in accordance with the methods of present invention. As used herein, low-k refers to a dielectric constant in the range of about 3.0 to about 2.0. As used herein, extreme low-k dielectrics are materials with a dielectric constant of less than 2.4. In some embodiments, as depicted in FIG. 2A, the low-k dielectric layer 202 may be formed over a hard mask 204. The hard mask 204 may be formed over a conductive layer 206. In some embodiments, the dielectric layer 202 may be an interlayer dielectric layer. In embodiments where the dielectric layer 202 is an interlayer dielectric layer, the dielectric layer 202 may generally separate the underlying conductive layer 206 from a conductive layer or a conductive feature (not shown) to be disposed above the dielectric layer 202.

In some embodiments, the dielectric layer 202 may comprise carbon and may further be porous. Examples of suitable dielectric materials include carbon doped silicon oxide (SiOC), silicon carbon nitride (SiCN), a low-k material, or the like. The low-k material may be carbon doped dielectric materials (such as BLACK DIAMOND® dielectric material available from Applied Materials, Inc. of Santa Clara, Calif., or the like), an organic polymer (such as polyimide, parylene, or the like), organic doped silicon glass (OSG), or the like.

In some embodiments, the conductive layer 206 may be fabricated from any suitable conductive material as used, for example, in the fabrication of integrated circuits and other semiconductor devices. In some embodiments, the conductive layer 206 may be fabricated from a metal such as copper, aluminum, or the like, alloys thereof, or combinations thereof.

In some embodiments, the substrate 200 may have one or more features disposed in or on the substrate. For example, in some embodiments, and as depicted in FIG. 2A, an opening 208 may be provided through the interlayer dielectric layer 202 to expose an upper surface of the hard mask 204. The opening 208 is generally defined by one or more sidewalls 210 and a bottom surface 212. The opening 208 may be any feature suitable for substrate fabrication, for example such as a via, a trench, a dual damascene feature, or the like, and may be formed through any suitable process such as an etch process. Although only one opening 208 is shown in FIGS. 2A-2E, multiple features may be simultaneously present in the substrate. The opening 208 may generally have any dimensions. For example, in some embodiments, the opening 208 may have a ratio of a height of the feature to a width of the feature of at least about 2:1. In some embodiments, the opening 208 may be a high aspect ratio feature. In such embodiments, the opening 208 may have a ratio of a height of the feature to a width of the feature of at least about 4:1. In some embodiments, the opening 208 may have a width of about 5 to about 50 nm.

The opening may be formed in a conventional manner, such as by patterning and etching the dielectric layer 202 to form the opening 208. Other processes may also be performed on the substrate 200 prior to providing the substrate at 102. For example, a chemical mechanical polishing (CMP) process may be performed to planarize an upper surface of the dielectric layer 202. Either or both of the CMP process or the etching of the opening 208 may undesirably remove carbon from the dielectric layer 202 (e.g., may have a carbon depletion effect) which undesirably leads to an increase in the dielectric constant, or k value, of the dielectric layer 202. In addition, other processing, such as cleaning of the substrate may also undesirably lead to an increase in the dielectric constant, or k value, of the dielectric layer 202.

Figure 2B:
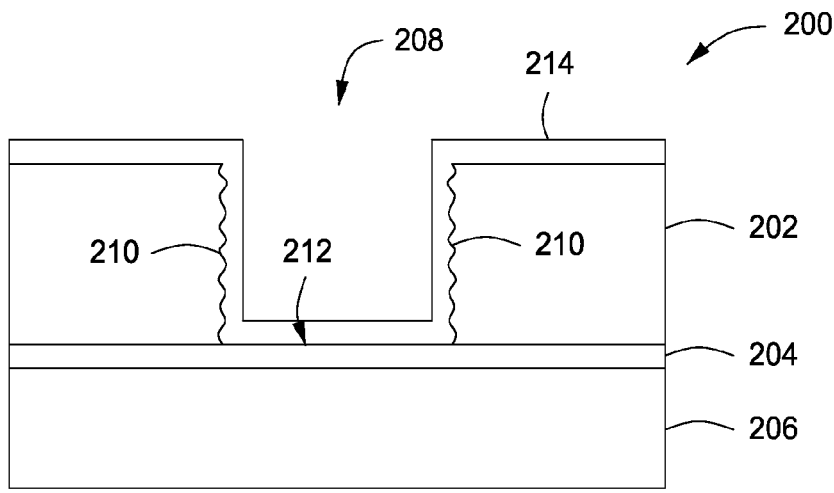

Next, at 104, a conformal oxide layer 214 is deposited atop the substrate 200, as depicted in FIG. 2B. In some embodiments, the conformal oxide layer 214 may comprise silicon oxide ($SiO_2$), carbon doped oxide (SiOC), or the like. The conformal oxide layer 214 may have a relatively high k value (e.g., greater than the k value of the underlying dielectric layer 202), such as about 4, or in the range of about 2.8 to about 3.4. In some embodiments, the conformal oxide layer 214 has a thickness of less than about 100 angstroms, such as less than about 50 angstroms, or about 20 to about 40 angstroms. The conformal oxide layer 214 may be deposited by any suitable method, such as chemical vapor deposition (CVD), plasma enhanced atomic layer deposition (PEALD), or the like. The conformal oxide layer may also be formed using other processes as well. The conformal oxide layer 214 may be formed over the surfaces of the dielectric layer 202, including and the sidewalls 210 and bottom 212 of the opening 208. The conformal oxide layer 214 advantageously removes the need for coating the dielectric layer 202 with a low-k material In some embodiments, a PEALD process may be used for the deposition of a conformal oxide layer 214, thereby providing high conformality and allowing for precise control of the thickness of the conformal oxide layer, which facilitates achieving the lowest possible integrated k value of the dielectric layer 202. For example, in some embodiments, the PEALD process may first expose the substrate 200 to one or more process gases including a precursor vapor. The precursor vapor may be organosilicone compounds such as octamethylcyclotetrasiloxane ($[(CH_3)_2SiO—]_4$), methyldiethoxysilane ($C_6H_{14}O_2SI$) or the like. The precursor vapor, along with helium, is flushed onto the substrate in a CVD chamber (not shown). The precursor flow rate may be, for example, about 1 to about 8 grams/minute and the helium gas flow rate may be, for example, about 400 to about 2000 sccm. RF power of 20 to about 100 W, having a frequency of 13.56 MHz may be used to form a plasma from the precursor gases. The CVD chamber may then be purged with a purge gas, for example, an inert gas, such as helium. In some embodiments, the purge gas may be combined with a carbon containing gas, such as one or more of methane ($CH_4$), ethylene ($C_2H_4$), ethane ($C_2H_6$), or propane ($C_3H_8$). The inert gas flow rate may be, for example, about 400 to about 2000 sccm. The carbon containing gas flow rate may be about 0 to about 4000 sccm. The purging is then followed by an RF plasma treatment with an inert gas, such as helium, or an oxidizing gas, such as oxygen. The inert gas flow rate may be, for example, about 400 to about 2000 sccm. The oxidizing gas flow rate may be, for example, about 0 to about 1000 sccm. High frequency RF power of 200 to about 1000 W with a frequency of 13.56 MHz may be used during the purging of the process chamber. In some embodiments, a low frequency RF power of up to about 150 W, with a frequency of about 200 to about 400 kHz, may be used during the purging of the process chamber. Finally, the CVD chamber is flushed again with an inert gas, such as helium or argon. The inert gas flow rate may be, for example, about 400 to about 2000 sccm. In some embodiments, the above steps may be repeated in the same order to achieve a desired film thickness. The PEALD process may be performed, for example, at a chamber pressure of about 2 to about 8 Torr and at a temperature of about 150 to about 400° C., such as about 200 to about 300° C.

Figure 2C:
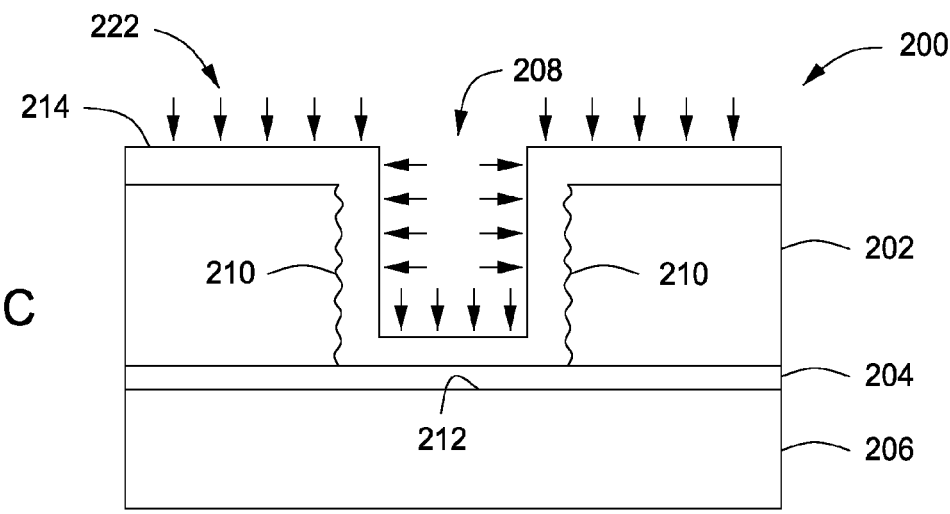

Next, at 106, the conformal oxide layer 214 may be doped with carbon in a plasma doping chamber, as depicted in FIG. 2C. The carbon plasma doping process exposes the substrate 200 to a plasma 222 comprising carbon to implant, or dope, the exposed surfaces of the substrate 200 (e.g., the conformal oxide layer 214, and optionally, other layers disposed beneath the conformal oxide layer 214) with carbon atoms. The carbon plasma doping process may be performed in any suitable process chamber such as, but not limited to, the plasma ion immersion implantation reactor commercially available from Applied Materials, Inc., of Santa Clara, Calif. Such a suitable reactor and its method of operation are set forth in U.S. Pat. No. 7,166,524, assigned to the assignee of the present invention. The carbon plasma doping process advantageously results in the restoration of carbon to the low-k dielectric layer 202 and further provides carbon to the conformal oxide layer 214.

Figure 3:
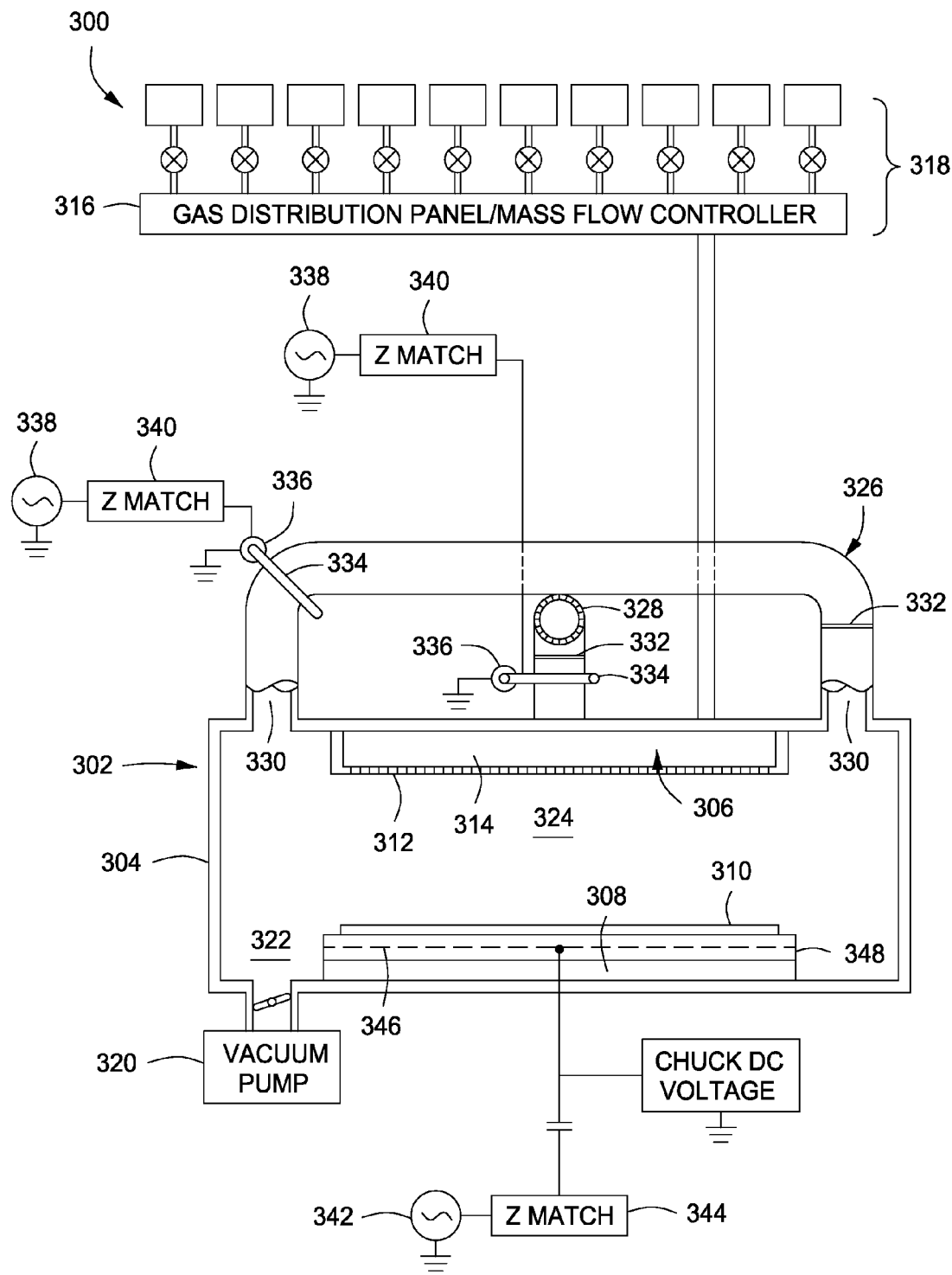
FIG. 3 depicts a plasma immersion ion implantation process chamber in accordance with some embodiments of the present invention.

Referring to FIG. 3, an illustrative toroidal source plasma immersion ion implantation ("P3i") reactor 300 suitable for performing the carbon plasma doping process may include a cylindrical vacuum chamber 302 defined by a cylindrical side wall 304 and a disk-shaped ceiling 306. A substrate support pedestal 308 at the floor of the chamber supports a substrate 310 to be processed. A gas distribution plate or showerhead 312 on the ceiling 306 receives process gas in its gas manifold 314 from a gas distribution panel 316 whose gas output can be any one of or mixtures of gases from one or more individual gas supplies 318. A vacuum pump 320 is coupled to a pumping annulus 322 defined between the substrate support pedestal 308 and the sidewall 304. A processing region 324 is defined between the substrate 310 and the gas distribution plate 312.

A pair of external reentrant conduits 326, 328 establishes reentrant toroidal paths for plasma currents passing through the processing region 324, the toroidal paths intersecting in the processing region 324. Each of the conduits 326, 328 has a pair of ends 330 coupled to opposite sides of the chamber. Each conduit 326, 328 is a hollow conductive tube. Each conduit 326, 328 has a D.C. insulation ring 332 preventing the formation of a closed loop conductive path between the two ends of the conduit.

An annular portion of each conduit 326, 328, is surrounded by an annular magnetic core 334. An excitation coil 336 surrounding the core 334 is coupled to an RF power source 338 through an impedance match device 340. The two RF power sources 338 coupled to respective ones of the cores 336 may be of two slightly different frequencies. The RF power coupled from the RF power generators 338 produces plasma ion currents in closed toroidal paths extending through the respective conduit 326, 328 and through the processing region 324. These ion currents oscillate at the frequency of the respective RF power source 338. Bias power is applied to the substrate support pedestal 308 by a bias power generator 342 through an impedance match circuit 344. In some embodiments, the bias power may be provided at up to about 5000 W, and may have a frequency of, for example, about 2 MHz. The bias power may be used to drive the carbon into both flat and sidewall surfaces of the one or more features. For example, the depth and profile of the carbon content in the conformal oxide layer and the dielectric layer 202 may advantageously be controlled by the amount of energy applied to the surface of the substrate (e.g., controlled by the bias power).

Plasma formation is performed by introducing a process gas, or mixture of process gases into the chamber 324 through the gas distribution plate 312 and applying sufficient source power from the RF power source 338 to the reentrant conduits 326, 328 to create toroidal plasma currents in the conduits and in the processing region 324. The source power may be up to about 1000 W, for example, at a frequency of about 2 to about 50 MHz, or about 13.56 MHz to form the plasma. In some embodiments, the source power can be reduced to zero after the bias RF is turned on. The source power may be controlled to provide a desired plasma density, or ion flux. The ion flux is dependent on RF power; higher RF power gives higher ion flux or plasma density. The higher the bias power, as compared to the source power, the deeper the amount of carbon present in the conformal oxide layer 214. The higher the source power, as compared to the bias power, the more carbon will be present at the surface of the conformal oxide layer 214.

The process gas includes a carbon containing gas, such as a carbon hydride with low carbon numbers. For example, the carbon containing gas may include one or more of methane ($CH_4$), ethylene ($C_2H_4$), ethane ($C_2H_6$), or propane ($C_3H_8$). Inert gases, such as helium or argon, may be added to dilute the carbon containing gas. Control over the dilution of the carbon containing gas advantageously facilitates control of the carbon profile in the conformal oxide layer 214 and the dielectric layer 202. In some embodiments, the conformal oxide layer 214 may be doped with carbon to achieve a concentration of about 25 to about 40 atomic percent carbon in the conformal oxide layer 214. The carbon containing gases provide carbon containing ions which may be implanted deeply into a certain thickness, for example about 100 angstroms, into the conformal oxide layer 214 with a fairly high concentration. A first portion, for example about 50 angstroms, has the highest carbon concentration and a relatively flat carbon profile because of the plasma immersion process. Providing a lower partial pressure of the carbon containing gas in the plasma, which can be achieved by adding dilution gases, provides the highly concentrated carbon layer a little deeper.

The ion flux proximate the wafer surface is determined by the wafer bias voltage applied by the RF bias power generator 342. The plasma rate or flux (number of ions sampling the wafer surface per square cm per second) is determined by the plasma density, which is controlled by the level of RF power applied by the RF source power generators 338. The cumulative ion dose (ions/square cm) at the wafer 310 is determined by both the flux and the total time over which the flux is maintained.

If the wafer support pedestal 308 is an electrostatic chuck, then a buried electrode 346 is provided within an insulating plate 348 of the wafer support pedestal, and the buried electrode 346 is coupled to the bias power generator 342 through the impedance match circuit 344. Wafer temperature, from about 5 to about 100 degrees Celsius, can be controlled through the control of the chuck. If a heated electrostatic chuck is used, the substrate temperature can be controlled to be about 80 to about 800 degrees Celsius, or about 25 to about 350 degrees Celsius.

In operation, and for example, the substrate 310 may be placed on the substrate support pedestal 308 and one or more process gases may be introduced into the chamber 302 to strike a plasma from the process gases. In some embodiments, a plasma may be generated from the process gases within the reactor 300 to selectively modify surfaces of the substrate 310 as discussed above. The plasma is formed in the processing region 324 by applying sufficient source power from the generators 338 to the reentrant conduits 326, 328 to create plasma ion currents in the conduits 326, 328 and in the processing region 324 in accordance with the process described above. In some embodiments, the wafer bias voltage delivered by the RF bias power generator 342 can be adjusted to control the flux of ions to the wafer surface, and possibly one or more of the thickness a layer formed on the wafer or the concentration of plasma species embedded in the wafer surface.

Figure 2D:
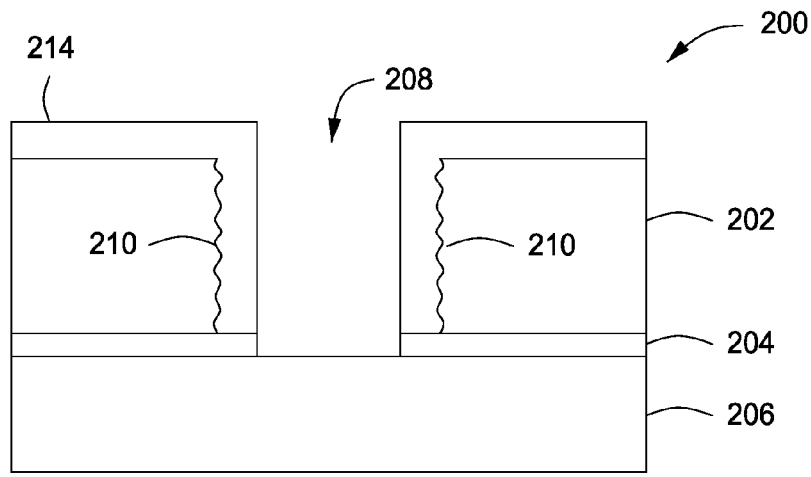

Next, at 108, the conformal oxide layer is removed from within the opening 208, as depicted in FIG. 2D. The conformal oxide layer may be removed by any suitable process such as etching.

Figure 2E:
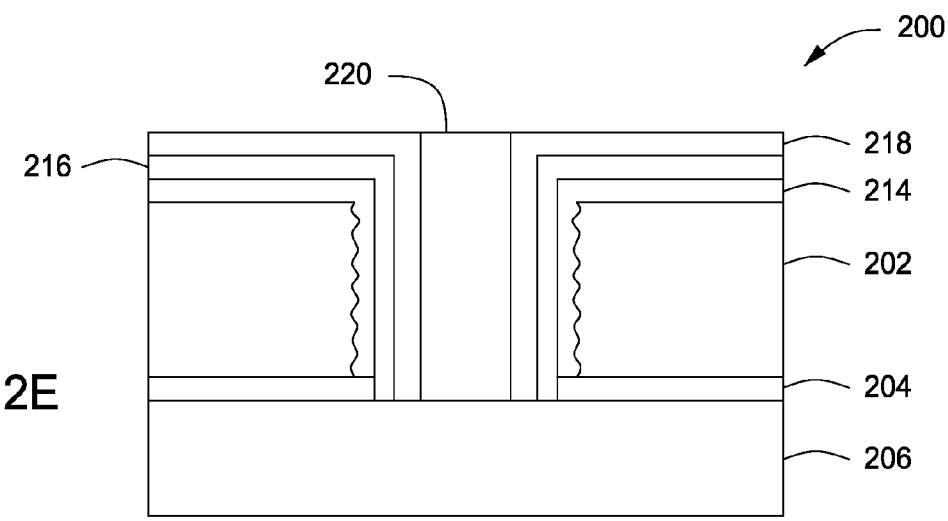

In some embodiments, for example where the one or more features is a via to provide a contact between conductive features on the substrate 200, next at 110, the opening 208 may be filled with a conductive material 220. In some embodiments, as depicted in FIG. 2E, a barrier layer 216 and a seed layer 218 may also be deposited in the opening 208. The barrier layer 216 may be deposited atop the substrate 200. When present, the barrier layer 216 may serve as an electrical and/or physical barrier between the substrate and layers to be subsequently deposited in the opening, and/or may function as a better surface for attachment during the deposition process discussed below than a native surface of the substrate. The barrier layer 216 may comprise any materials suitable to perform the above discussed functions. For example, in some embodiments, the barrier layer 216 may comprise one of titanium (Ti), tantalum (Ta), oxides or nitrides thereof, or the like. The barrier layer 216 may be deposited to any suitable thickness, for example, about 0.5 to about 10 nm. The barrier layer 216 may be deposited by any suitable method, for example, such as chemical vapor deposition (CVD), physical vapor deposition (PVD), or the like.

The seed layer 218 may be deposited within the opening 208 The seed layer 218 provides a better surface for attachment and may act as a template for subsequently deposited materials, for example, such as the conductive materials discussed below. The seed layer 218 may comprise any materials suitable to provide the aforementioned functions. For example, in some embodiments, the seed layer may comprise one of copper (Cu), ruthenium (Ru), cobalt (Co), or the like, and alloys thereof, such as copper-aluminum (Cu—Al), copper-manganese (Cu—Mn), copper-magnesium (Cu—Mg), or the like. The seed layer 218 may be deposited via any deposition process suitable to form the seed layer having a desired profile, for example, such as PVD, CVD, ALD, PEALD, or the like.

The conductive material 220 may be deposited atop the seed layer 218 to fill the opening 208. In embodiments where the seed layer 218 does not form a continuous layer (not shown), portions of the conductive material 220 may be deposited directly atop the barrier layer 216. The conductive material 220 may be deposited in any manner such as electrochemical deposition, or electrochemical plating, or the like. The conductive material 220 may be any suitable conductive material, such as aluminum (Al), copper (Cu), or the like.

After filling the opening 208 with the conductive material 220, chemical mechanical polishing (CMP) or other suitable technique may be used to remove the excess conductive material 220 outside the opening 208 (and any other features, such as other vias, trenches, dual damascene structures, or the like). After depositing the conductive material 220 to fill the opening 208, the method generally ends and the substrate 200 may proceed for further processing, such as deposition, etching, annealing, or the like. In some embodiments, additional layers may be deposited, for example additional dielectric layers and/or metallization structures may be formed over the filled opening 208.

Thus, methods for repairing low-k dielectrics using carbon plasma immersion are provided herein. While the foregoing is directed to embodiments of the present invention, other and further embodiments of the invention may be devised without departing from the basic scope thereof.

We claim:

1. A method of repairing a dielectric material disposed on a substrate having one or more features disposed through the dielectric material, comprising:
    depositing a conformal oxide layer on the dielectric material and within the one or more features; and
    subsequently, doping the conformal oxide layer with carbon, using a plasma doping process, wherein carbon is implanted through the conformal oxide layer and into the dielectric material.

2. The method of claim 1, wherein the conformal oxide layer comprises silicon dioxide or carbon doped silicon oxide.

3. The method of claim 1, wherein the substrate further comprises a dielectric layer comprising the dielectric material, a hard mask layer disposed beneath the dielectric layer, and a conductive layer disposed beneath the hard mask layer, and wherein the one or more features further comprises a via disposed through the dielectric layer and the hard mask layer to expose a surface of the conductive layer, and further comprising:
    removing the conformal oxide layer from a bottom surface of the one or more features to expose a portion of the conductive layer; and
    filling the one or more features with a conductive material.

4. The method of claim 3, wherein the dielectric material has a k value range of about 2.2 to about 2.5.

5. The method of claim 3, wherein the conductive layer comprises at least one of copper, aluminum, and alloys thereof.

6. The method of claim 1, wherein depositing the conformal oxide layer further comprises:
    depositing the conformal oxide layer in a chemical vapor deposition (CVD) process or plasma enhanced atomic layer deposition (PEALD).

7. The method of claim 6, wherein the CVD or PEALD process is repeated until the thickness of the conformal oxide layer is about 20 to about 70 angstroms.

8. The method of claim 1, wherein thickness of the conformal oxide layer is less than about 100 angstroms.

9. The method of claim 1, wherein doping the conformal oxide layer further comprises:
    exposing the substrate to an inductively formed plasma comprising carbon; and
    applying a bias voltage to the substrate.

10. The method of claim 9, wherein doping the conformal oxide layer is performed in a plasma immersion ion implantation reactor.

11. The method of claim 9, wherein exposing the substrate to the inductively formed plasma comprises providing a process gas comprising carbon to a process chamber having the substrate disposed therein and forming a plasma from the process gas.

12. The method of claim 11, wherein the process gas comprises at least one carbon containing gas comprising methane ($CH_4$), ethylene ($C_2H_4$), ethane ($C_2H_6$), or propane ($C_3H_8$).

13. The method of claim 11, wherein the carbon containing process gas is diluted with an inert gas, and wherein the dilution of the carbon containing process gas controls a carbon profile in the conformal oxide layer.

14. The method of claim 9, wherein exposing the substrate to the inductively formed plasma comprises providing up to about 1000 W of RF power at a frequency of about 13.56 MHz to form the plasma.

15. The method of claim 9, wherein doping the conformal oxide layer further comprises biasing the substrate with up to about 5000 W of RF power at a frequency of about 2 MHz.

16. The method of claim 9, wherein doping the conformal oxide layer further comprises maintaining the substrate temperature in the range of about 5 degrees Celsius to about 100 degrees Celsius.

17. The method of claim 9, wherein doping the conformal oxide layer further comprises implanting about 25 to about 40 atomic percent carbon in the conformal oxide layer.

18. The method of claim 1, further comprising:
    processing the substrate in a manner that depletes at least some carbon from the dielectric material prior to depositing the conformal oxide layer.

19. A method of repairing a low-k dielectric material disposed on a substrate comprising a conductive layer, a hard mask layer disposed over the conductive layer, and a low-k dielectric layer disposed over the hard mask layer, wherein one or more features are disposed through the low-k dielectric layer and the hard mask layer to expose a surface of the hard mask layer, the method comprising:
- depositing a conformal oxide layer comprising silicon dioxide on the dielectric material and within the one or more features;
- subsequently, doping the conformal oxide layer with carbon, using a plasma doping chamber, wherein carbon is implanted through the conformal oxide layer and into the dielectric material;
- removing the conformal oxide layer from a bottom surface of the one or more features; and
- filling the one or more features with a conductive material.

20. A method of repairing a dielectric material disposed on a substrate having one or more features disposed through the dielectric material, comprising:
- depositing a conformal oxide layer on the dielectric material and within the one or more features; and
- subsequently, doping the conformal oxide layer with carbon, using a plasma doping process, wherein the k value of the conformal oxide layer is greater than the k value of the dielectric material.

* * * * *